(12) United States Patent
Lo et al.

(10) Patent No.: US 12,439,736 B2
(45) Date of Patent: Oct. 7, 2025

(54) MICRO LED DISPLAY DEVICE

(71) Applicant: PlayNitride Display Co., Ltd., Miaoli County (TW)

(72) Inventors: Yu-Yun Lo, Miaoli County (TW); Bo-Wei Wu, Miaoli County (TW); Shih-Yao Liang, Miaoli County (TW)

(73) Assignee: PLAYNITRIDE DISPLAY CO., LTD., Miaoli County (TW)

( * ) Notice: Subject to any disclaimer, the term of this patent is extended or adjusted under 35 U.S.C. 154(b) by 770 days.

(21) Appl. No.: 17/832,351

(22) Filed: Jun. 3, 2022

(65) Prior Publication Data

US 2023/0163108 A1     May 25, 2023

(30) Foreign Application Priority Data

Nov. 22, 2021 (TW) .................. 110143436

(51) Int. Cl.
| | |
|---|---|
| *H10H 20/813* | (2025.01) |
| *H01L 25/075* | (2006.01) |
| *H10H 20/01* | (2025.01) |
| *H10H 20/814* | (2025.01) |
| *H10H 20/816* | (2025.01) |
| *H10H 20/821* | (2025.01) |
| *H10H 20/851* | (2025.01) |
| *H10H 20/857* | (2025.01) |

(52) U.S. Cl.
CPC ..... *H10H 20/8132* (2025.01); *H01L 25/0753* (2013.01); *H10H 20/017* (2025.01); *H10H 20/814* (2025.01); *H10H 20/8162* (2025.01); *H10H 20/821* (2025.01); *H10H 20/8514* (2025.01); *H10H 20/857* (2025.01)

(58) Field of Classification Search
None
See application file for complete search history.

(56) References Cited

U.S. PATENT DOCUMENTS

| | | | |
|---|---|---|---|
| 2020/0168663 A1 | 5/2020 | Choi et al. | |
| 2023/0033031 A1* | 2/2023 | Chen | ............... H10H 20/01 |

FOREIGN PATENT DOCUMENTS

| | | |
|---|---|---|
| TW | 202044610 A | 12/2020 |
| TW | I-747327 B | 11/2021 |
| WO | WO-2020157149 A1 | 8/2020 |

* cited by examiner

*Primary Examiner* — Feifei Yeung Lopez
(74) *Attorney, Agent, or Firm* — MUNCY, GEISSLER, OLDS & LOWE, P.C.

(57) ABSTRACT

A micro LED display device includes a circuit substrate, an epitaxial structure layer and a metal reflective layer. The circuit substrate includes a display area and a non-display area adjacent to the display area. The epitaxial structure layer includes a first surface facing the circuit substrate, a second surface away from the circuit substrate, and a plurality of ion implantation regions facing the circuit substrate. The ion implantation regions define a plurality of micro LED units spaced apart from each other. The first surface is a planar surface within the display area, and each groove in the second surface corresponds to one of the ion implantation regions. The metal reflective layer includes a plurality of reflective portions corresponding to the grooves. The reflective portions define a plurality of light transmission regions, and each light transmission region corresponds to one of the micro LED units.

15 Claims, 9 Drawing Sheets

MICRO LED DISPLAY DEVICE

CROSS REFERENCE TO RELATED APPLICATIONS

This Non-provisional application claims priority under 35 U.S.C. § 119(a) on Patent Application No(s). 110143436 filed in Taiwan, Republic of China on Nov. 22, 2021, the entire contents of which are hereby incorporated by reference.

BACKGROUND

Technology Field

The present disclosure relates to a display device and, in particular, to a micro LED (micro light-emitting diode) display device.

Description of Related Art

Now the world is paying attention to the future display technology, and the micro light-emitting diode (micro LED) is one of the most promising technologies. In brief, micro LED is a technology of miniaturizing and matrixing LED, thereby arranging millions or even tens of millions of dies, which are smaller than 100 microns and thinner than a hair, on a substrate.

In the application of current micro LED display devices, such as the VR or AR device requiring high resolution (e.g. more than 2500 PPI) and ultra-high brightness (e.g. more than 10,000 nits), since the sub-pixels (micro LEDs) has ultra-high brightness, the light leakage from one sub-pixel may interfere the other neighboring sub-pixels. In addition, the surface of the micro LED can be damaged by the etching process, which will decrease the light-emitting efficiency.

Therefore, it is desired to provide a micro LED display device that can prevent the damage of the surface of micro light-emitting component caused by the manufacturing process so as to remain the light-emitting efficiency, and improve the light interference issue between the sub-pixels.

SUMMARY

One or more exemplary embodiments of this disclosure are to provide a novel micro LED display device that can prevent the damage of the surface of micro light-emitting component so as to remain the light-emitting efficiency, and improve the light interference issue between the sub-pixels.

In an exemplary embodiment, a micro LED display device of this disclosure includes a circuit substrate, an epitaxial structure layer, and a metal reflective layer. The circuit substrate includes a display area and a non-display area adjacent to the display area. The epitaxial structure layer is disposed on the circuit substrate and includes a first surface facing the circuit substrate, a second surface away from the circuit substrate, and a plurality of ion implantation regions facing the circuit substrate. The ion implantation regions define a plurality of micro LED units spaced apart from each other. The micro LED units are electrically connected to the circuit substrate and are individually controlled to emit light. The first surface is a planar surface within the display area, the second surface has a plurality of grooves, and each of the grooves corresponds to one of the ion implantation regions. The metal reflective layer includes a plurality of reflective portions. The reflective portions are correspondingly disposed in the grooves and protruded from the second surface of the epitaxial structure layer. The reflective portions define a plurality of light transmission regions spaced apart from each other, and each of the light transmission regions corresponds to one of the micro LED units.

In one embodiment, the epitaxial structure layer further includes a continuous semiconductor layer, and the semiconductor layer is a common layer of the micro LED units.

In one embodiment, each of the micro LED units includes a first type semiconductor layer, a light-emitting layer and a second type semiconductor layer stacked in order, and an implantation depth of the ion implantation region is greater than a maximum vertical distance between the first surface and the light emitting-layer of the micro LED unit adjacent to the ion implantation region.

In one embodiment, the ion implantation regions of the epitaxial structure layer do not emit light.

In one embodiment, the micro LED display device further includes a light conversion layer disposed in a part of the light transmission regions, and the light conversion layer is configured to convert a wavelength of a light emitted from the corresponding micro LED unit.

In one embodiment, the circuit substrate further includes a plurality of conductive electrodes, and one of the conductive electrodes is electrically connected to one of the micro LED units via a conductive member.

In one embodiment, the first surface of the epitaxial structure layer further has a concave portion in the non-display area, and the circuit substrate outputs a common electrode signal to the epitaxial structure layer through a conductive member connecting to the concave portion.

In one embodiment, the epitaxial structure layer further includes an outside surface, and the circuit substrate outputs a common electrode signal to the epitaxial structure layer through a conductive member connecting to the outside surface.

In one embodiment, the reflective portion and the corresponding ion implantation region are overlapped in a direction perpendicular to the first surface.

In one embodiment, a distance between the reflective portion and the corresponding ion implantation region is greater than 0 and is less than or equal to 2 µm.

In one embodiment, the reflective portion directly contacts the corresponding ion implantation region.

In one embodiment, each of the reflective portions includes a first stacked layer located in the corresponding groove, and a second stacked layer protruding from the corresponding groove.

In one embodiment, the micro LED display device further includes a light-shielding structure, which includes a plurality of light-shielding portions arranged on the reflective portions and exposing the light transmission regions.

In one embodiment, one side of each of the reflective portions away from the epitaxial structure layer is configured with a concave portion, and a material of each of the light-shielding portions is filled into the corresponding concave portion.

In one embodiment, the micro LED display device further includes a light transmission layer disposed at one side of the light conversion layer away from the epitaxial structure layer.

In one embodiment, the micro LED display device further includes a light filter layer disposed at one side of the light conversion layer away from the epitaxial structure layer. The light filter layer includes a plurality of light filter portions, the light conversion layer includes a plurality of light conversion portions, and the light filter portions respectively correspond to the light conversion portions.

In one embodiment, the micro LED display device further includes a light filter substrate disposed at one side of the metal reflective layer away from the epitaxial structure layer. The light filter substrate includes a plurality of light filter portions, the light conversion layer includes a plurality of light conversion portions, and the light filter portions respectively correspond to the light conversion portions. In one embodiment, the width of the micro LED unit is 2~5 μm.

In one embodiment, the product of the maximum brightness and the resolution of the micro LED display device is greater than 108.

As mentioned above, without utilizing the conventional etching process in the manufacturing of micro LED units, this disclosure implants ions on the first surface of the epitaxial structure layer facing the circuit substrate to form a plurality of separated ion implantation regions, thereby defining a plurality of micro LED units. Accordingly, this disclosure can prevent the damage of the sidewall of micro light-emitting component, thereby remaining the light-emitting efficiency. In addition, this disclosure further provides a metal reflective layer for increasing the conductivity of common electrode to enhance the light-emitting efficiency of micro LED display device. Moreover, the metal reflective layer has a reflection or light concentrating function, which can avoid the light crosstalk problem between sub-pixels and thus match the demand for high-resolution display.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
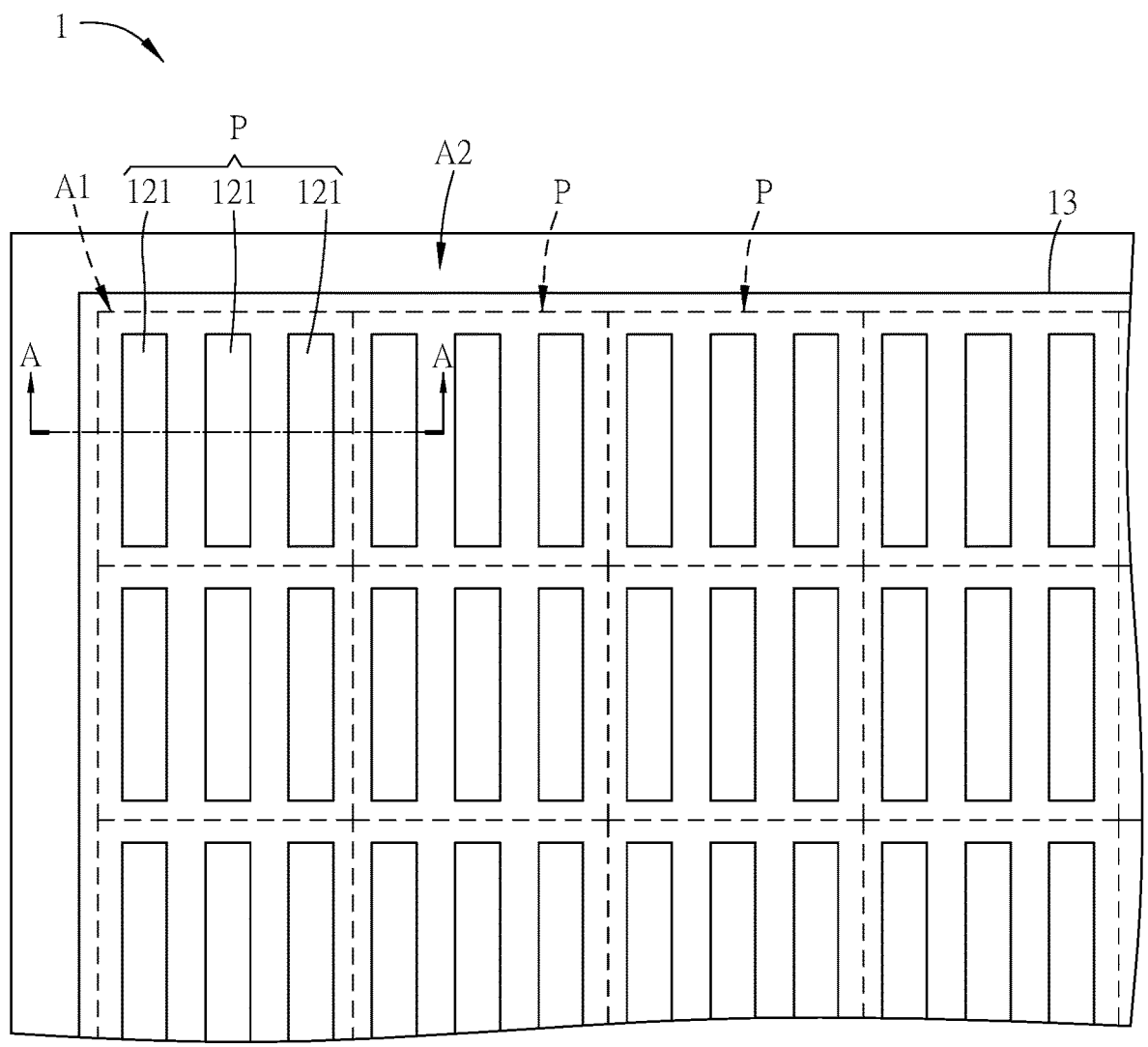
FIG. 1A is a schematic diagram showing a micro LED display device according to an embodiment of this disclosure.
Figure 1B:
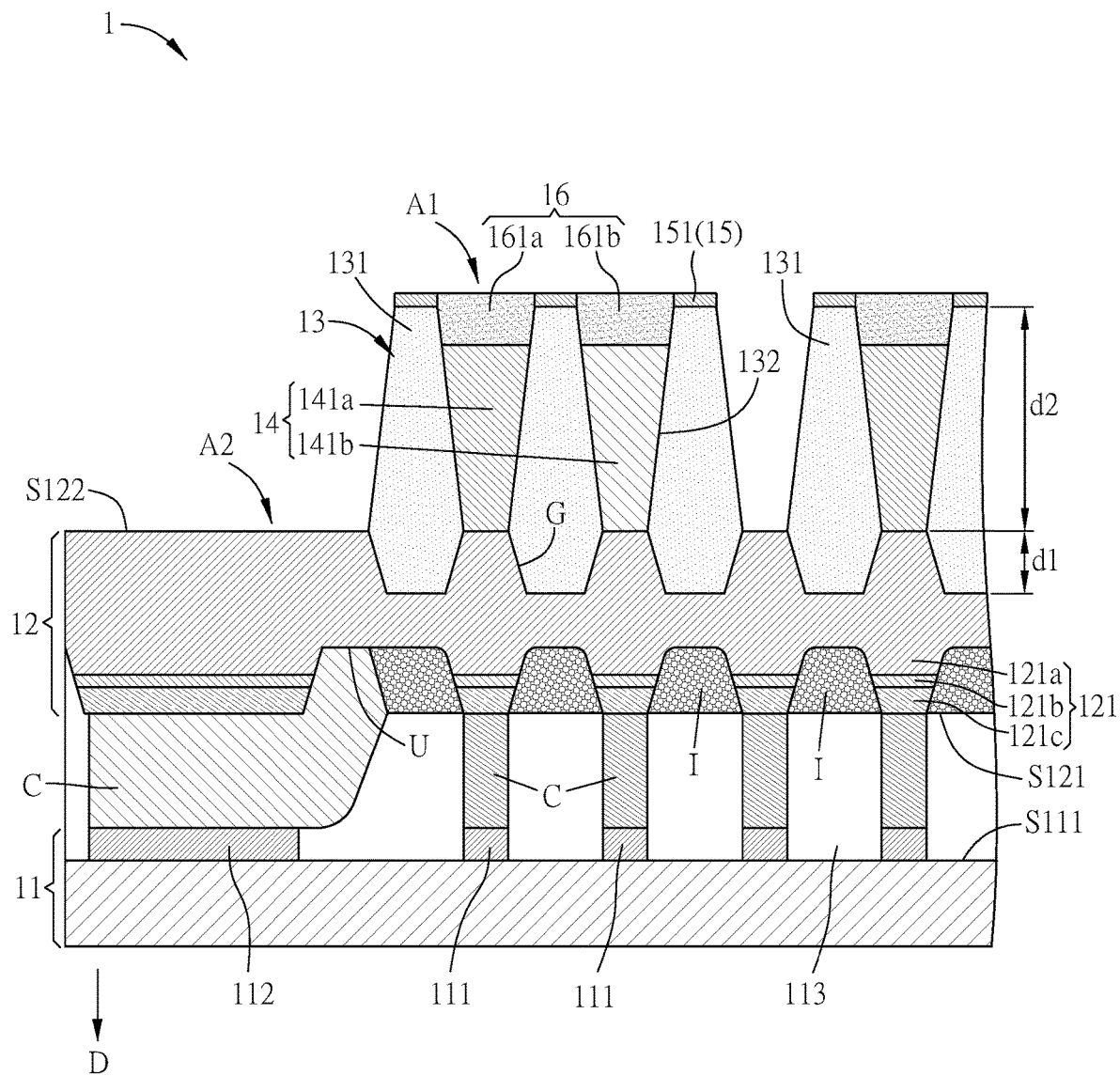
FIG. 1B is a sectional view of the micro LED display device of FIG. 1A along the line A-A.
Figure 1C:
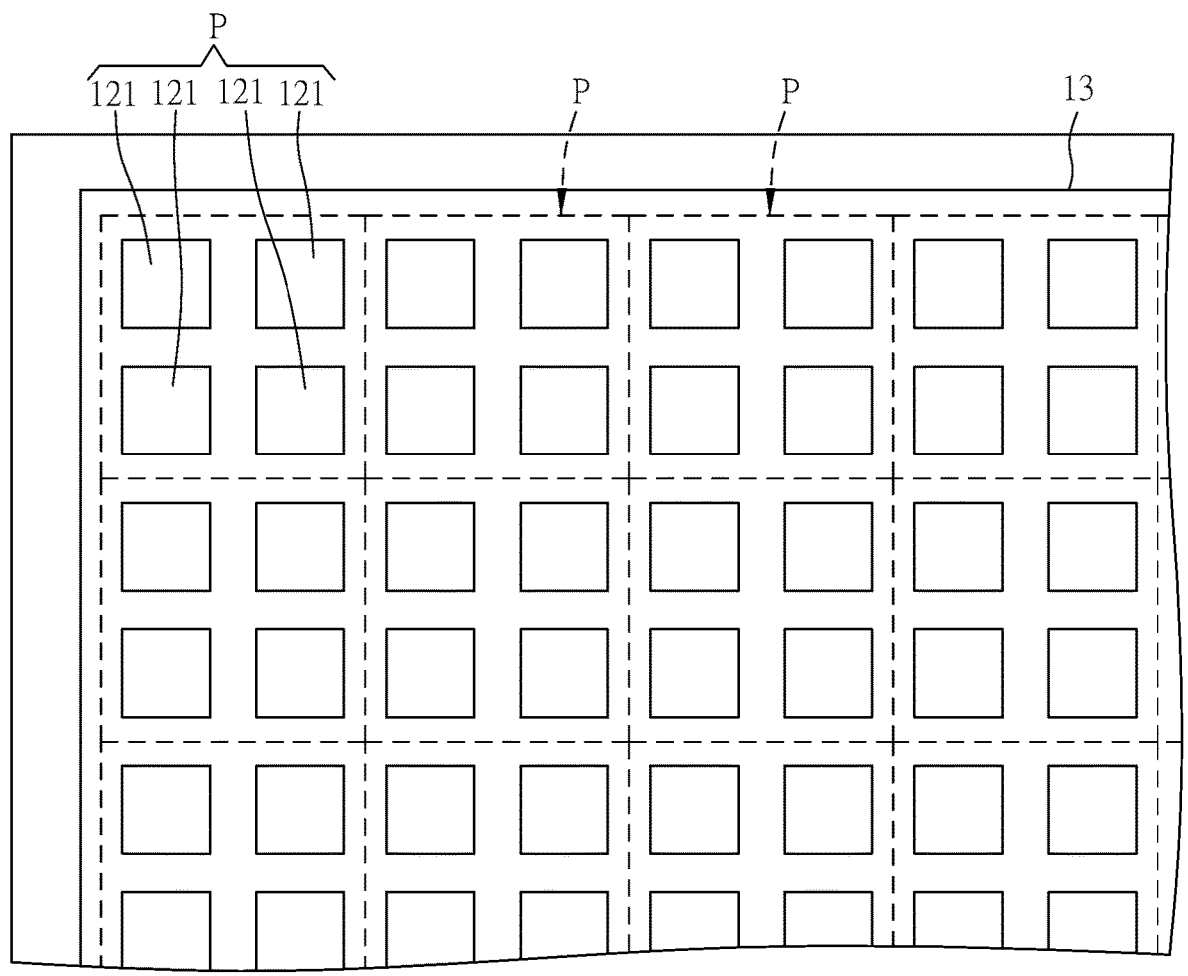
FIG. 1C is a schematic diagram showing a micro LED display device according to another embodiment of this disclosure.

FIG. 1A is a schematic diagram showing a micro LED display device according to an embodiment of this disclosure, and FIG. 1B is a sectional view of the micro LED display device of FIG. 1A along the line A-A. FIG. 1C is a schematic diagram showing a micro LED display device according to another embodiment of this disclosure.

As shown in FIGS. 1A and 1C, the micro LED display device 1 includes a plurality of pixels P, which are arranged in a matrix with multiple rows and columns. Referring to FIG. 1A, each pixel P of this embodiment includes three sub-pixels arranged side by side, and each sub-pixel includes a micro LED unit 121. That is, each pixel P includes three micro LED units 121 arranged side by side. In other embodiments, the three sub-pixels in each pixel P can be arranged in a different way. For example, two of the three sub-pixels are arranged up and down, and the third one of the three sub-pixels is located beside the other two sub-pixels. To be noted, other arrangements are also acceptable. In different embodiments, each pixel P may include four or more sub-pixels. Taking the pixel P including four sub-pixels as an example, the four sub-pixels can be arranged side by side, or in a 2*2 array (see FIG. 1C), or any of other suitable arrangements. Referring to FIG. 1C, each of the upper two sub-pixels includes a green micro LED unit 121, and the lower two sub-pixels include a blue micro LED unit 121 and a red micro LED unit 121, respectively. This disclosure is not limited thereto, and the colors of the micro LED units 121 and the arrangement thereof can be optionally determined based on the requirement.

As shown in FIG. 1B, the micro LED display device 1 of this embodiment can be an active matrix (AM) LED micro display device or a passive matrix (PM) LED micro display device. The micro LED display device 1 includes a circuit substrate 11, an epitaxial structure layer 12, and a metal reflective layer 13. In addition, the micro LED display device 1 of this embodiment further includes a light conversion layer 14 and a light-shielding structure 15.

The circuit substrate 11 includes a display are a display area A1 and a non-display area A2. The display area A1 indicates the light-emitting area of the micro LED display device 1, which corresponds to the positions of the pixels P (the micro LED units 121) of the panel. The non-display area A2 is located adjacent to the display area A1. For example, the non-display area A2 can be located at the periphery of the display area A1 (the micro LED units 121). The circuit substrate 11 has a bonding surface S111. In this embodiment, the bonding surface S111 is the upper surface of the circuit substrate 11. The circuit substrate 11 is a driving substrate for driving the micro LED units 121 to emit light. For example, the circuit substrate 11 may be a complementary metal-oxide-semiconductor (CMOS) substrate, a liquid crystal on silicon (LCOS) substrate, or a thin-film transistor (TFT) substrate, or any of other driving substrates with working circuits, but this disclosure is not limited thereto. In some embodiments, the micro LED display device 1 is a micro display applied to AR or VR applications. The length of the circuit substrate 11 can be, for example but not limited to, less than or equal to 1 inch, the PPI (pixels per inch) thereof can be greater than 1000 or 2500, and the brightness thereof is greater than 10,000 nits. In other embodiments, the length of the circuit substrate 11 can be greater than 1 inch, and the PPI thereof is not limited.

The epitaxial structure layer 12 is disposed on the bonding surface S111 of the circuit substrate 11, and the epitaxial structure layer 12 includes a first surface S121 facing the circuit substrate 11, a second surface S122 away from the circuit substrate 11, and a plurality of ion implantation regions I facing the circuit substrate 11. The ion implantation regions I define a plurality of micro LED units 121 spaced apart from each other. In other words, the ion implantation regions I are formed at one side of the epitaxial structure layer 12 facing the circuit substrate 11. The micro LED units 121 are electrically connected to the circuit substrate 11 and are individually controlled to emit light. Thus, the circuit substrate 11 can control (drive) the micro LED units 121 to emit light. Herein, the ion implantation regions I are formed by an ion implantation process such as an ICP (Inductively Couple Plasma) Mesa process. The first surface S121 of the epitaxial structure layer 12 facing the circuit substrate 11 is a planar surface within the display area A1. Specifically, as shown in FIG. 1B, the first surface S121 is coplanar with the surfaces of the ion implantation regions I. In other words, the first surface S121 and the surfaces of the ion implantation regions I can together form a continuous co-plane. In some embodiments, the ions implanted into the epitaxial structure layer 12 can be, for example but not limited to, As ions, Ar ions, or Kr ions. These implanted ions can destroy the original characteristics of (the light-emitting layer of) the epitaxial structure layer 12, thereby defining a plurality of micro LED units 121 spaced apart from each other. For example, the implanted As ions can neutralize the electron holes in a P-type semiconductor layer of the epitaxial structure layer 12, thereby reducing the number of electron holes so as to decrease the number of photons generated in the combination of the light-emitting layer and electrons. In addition, the implanted Ar ions can destroy the epitaxial lattice, so that the impedance is increased so as to generate the insulation effect. In this embodiment, the first surface S121 of the epitaxial structure layer 12 is a planar surface in the display area A1 and is substantially parallel to the bonding surface S111 of the circuit substrate 11. In addition, the second surface S122 of the epitaxial structure layer 12 away from the circuit substrate 11 has a plurality of grooves G, and each groove G corresponds to one of the ion implantation regions I (i.e. one groove G corresponds to one ion implantation region I).

In this embodiment, each micro LED unit 121 can provide the light source for one corresponding sub-pixel, and each micro LED unit 121 comprises a first type semiconductor layer 121a, a light-emitting layer 121b, and a second type semiconductor layer 121c, which are stacked in order. The light-emitting layer 121b is sandwiched between the first type semiconductor layer 121a and the second type semiconductor layer 121c. For example, the first type semiconductor layer 121a is an N-type semiconductor layer, the second type semiconductor layer 121c is a P-type semiconductor layer, and the light-emitting layer 121b is a multiple quantum well (MQW) layer. This disclosure is not limited thereto. Specifically, the epitaxial structure layer 12 of this embodiment comprises one continuous first type semiconductor layer 121a, and the micro LED units 121 commonly utilizes the same one first type semiconductor layer 121a. To be noted, this disclosure is not limited thereto. In different embodiments, the first type semiconductor layer 121a can be a P-type semiconductor layer, the second type semiconductor layer 121c can be an N-type semiconductor layer. In this case, the micro LED units 121 commonly utilizes the same P-type semiconductor layer. Moreover, the light-emitting layer 121b of the micro LED units 121 can generate and emit light, and the ion implantation regions I of the epitaxial structure layer 12 do not generate light because that the implanted ions change the electrical property and the electrons and the holes can't recombine in the ion implantation regions I of the epitaxial structure layer 12 (including parts of the original light-emitting layer).

In some embodiments, in the direction D perpendicular to the first surface S121 of the epitaxial structure layer 12, the maximum distance between the first surface S121 and the light-emitting layer 121b of the epitaxial structure layer 12 can be, for example, 0.6~0.7 μm, and the minimum distance between the second surface S122 and the light-emitting layer 121b of the epitaxial structure layer 12 can be, for example, 3~3.5 μm. In some embodiments, the implantation depth of the ion implantation region I is greater than the maximum vertical distance between the first surface S121 and the light-emitting layer 121b of the adjacent epitaxial structure layer 12. In some embodiments, the width of the ion implantation region I can be, for example, 0.5~3 μm, and the width of the micro LED unit 121 can be, for example, 2~5 μm. To be noted, the above-mentioned values are for illustrations, and are not to limit the scope of this disclosure. In some embodiments, the width of the micro LED unit 121, which is defined as the pixel pitch, can be, for example, 3~10 μm. In practice, when the width of the micro LED unit 121 is 2~3 μm, this disclosure can further improve the light-emitting efficiency of micro LED display device and achieve the requirement of high resolution. In some embodiments, the width of the micro LED unit 121 (i.e. the pixel pitch) is 2~5 μm, and this configuration is suitable for manufacturing an ultra LED display device. In this case, the product of the maximum brightness (nits) and the resolution (PPI) of the micro LED display device is greater than 108.

In addition, the circuit substrate 11 of this embodiment further includes a plurality of conductive electrodes (111, 112), which are disposed corresponding to the micro LED units 121 of the epitaxial structure layer 12 (e.g. in the one-to-one arrangement). In this embodiment, each conductive electrode is electrically connected to the corresponding circuit layer (not shown) of the circuit substrate 11. Accordingly, the circuit substrate 11 can transmit the individually controlled electric signal to the conductive electrode through the corresponding circuit layer, thereby driving the corresponding micro LED unit 121 to emit light. One of the conductive electrodes can be electrically connected to one of the micro LED units 121 via a conductive member C. The conductive electrodes of this embodiment may include a plurality of first electrodes 111 (FIG. 1B shows four first electrodes 111) and a second electrode 112. Each first electrode 111 is electrically connected to the second type semiconductor layer 121c of one corresponding micro LED unit 121 via one corresponding conductive member C, and the second electrode 112 is the common electrode of the epitaxial structure layer 12 and is electrically connected to the first semiconductor layers 121a of the corresponding micro LED units 121 via one corresponding conductive member C. The above-mentioned conductive members C can include, for example but not limited to, indium, tin, copper, silver, gold, or an alloy thereof (e.g., copper plus any of the above-mentioned metals (excluding tin)), and this disclosure is not limited.

In order to obtain the uniform brightness and reduce the power consumption, the micro LED display device 1 of this embodiment does not electrically connect the semiconductor layer of micro LEDs (e.g., the first type semiconductor layer 121a) to the circuit substrate 11 with the conventional metal grid. In this embodiment, the first surface S121 of the epitaxial structure layer 12 further has a concave portion U in the non-display area A2, and the conductive member C is filled in the concave portion U and contacts the epitaxial structure layer 12 (i.e. the first type semiconductor layer 121a). Therefore, the common electrode signals can be transmitted from the circuit substrate 11 to the epitaxial structure layer 12 via the common electrode (i.e. the second electrode 112) and the conductive member C connected to the concave portion U. In addition, the micro LED display device 1 of this embodiment further includes a solder resist layer 113 disposed between the bonding surface S111 and the epitaxial structure layer 12. The solder resist layer 113 can not only provide a buffer during the pressing process to avoid the breaking of the epitaxial structure layer 12, but also prevent a short circuit between the first electrode 111 and the second electrode 112. The material of the solder resist layer 113 may include, for example but is not limited to, an inorganic dielectric material (e.g., silicon nitride or silicon oxide), or an organic polymer material (e.g., photoresist or ink).

The metal reflective layer 13 includes a plurality of reflective portions 131, which are correspondingly disposed in the grooves G and protruded from the second surface S122 of the epitaxial structure layer 12. In this embodiment, each reflective portion 131 fully fills the corresponding groove G and protrudes from the second surface S122 toward the direction away from the circuit substrate 11, thereby forming the metal reflective layer 13. Herein, each reflective portion 131 of the metal reflective layer 13 and the corresponding ion implantation region I are overlapped in the direction D perpendicular to the first surface S121. The metal reflective layer 13 directly contacts the first type semiconductor layer 121a of the epitaxial structure layer 12 so as to electrically connect the corresponding micro LED unit 121. In addition, the metal reflective layer 13 further electrically connects the circuit substrate 11. For example, the metal reflective layer 13 can be electrically connected to the second electrode 112 of the circuit substrate 11 via the first type semiconductor layer 121a of the epitaxial structure layer 12. In each reflective portion 131 of this embodiment, the reflective material located inside the groove G is the same as the reflective material protruding from the second surface S122 of the epitaxial structure layer 12. However, this disclosure is not limited thereto. In different embodiments, the material of a part of the reflective portion 131 located inside the groove G can be different from the material of a part of the reflective portion 131 protruding from the groove G. In other words, a first kind of reflective material is formed inside the groove G, and then a second kind of reflective material is formed on the first kind of reflective material, thereby forming the reflective portion 131 with two different materials. That is, each reflective portion 131 includes a first stacked layer located in the corresponding groove G, and a second stacked layer protruding from the corresponding groove G (the material of the first stacked layer is different from that of the second stacked layer). Certainly, the material of the first stacked layer can be the same as that of the second stacked layer, and this disclosure is not limited thereto.

The reflective portions 131 of the metal reflective layer 13 can define a plurality of light transmission regions 132 spaced apart from each other, and each of the light transmission regions 132 corresponds to one of the micro LED units 121. That is, the light transmission regions 132 correspond to the micro LED units 121 respectively (in the one-to-one manner). In this embodiment, each light transmission region 132 overlaps with the corresponding micro LED unit 121 in the direction D perpendicular to the first surface S121. Herein, each light transmission region 132 can be a through hole formed on the metal reflective layer 13, and the through hole communicates the upper and lower surfaces of the metal reflective layer 13. Accordingly, the light emitted from the micro LED units 121 corresponding to the light transmission regions 132 can pass through the through holes (light transmission regions 132) and be outputted upwardly. That is, the light emitted from the micro LED units 121 can pass through the through holes to display images. The material of the metal reflective layer 13 can be a conductive metal material, such as silver, aluminum, copper, titanium, chromium or nickel, or their alloys. In other embodiments, the metal reflective layer 13 can be formed by stacking a plurality of layers. For example, a high-conductive material is provided to contact the epitaxial structure layer 12, and one or more composite layers (e.g. a layer of high-reflective material, barrier layer, etc.) are formed on the high-conductive material. Herein, the barrier layer is configured to prevent the reaction of the metal material and the light conversion layer 14, which may decrease the light conversion efficiency.

Namely, the reflective portion 131 is used to reflect (block) the light emitted from the micro LED unit 121. Since there is one micro LED unit 121 configured between two reflective portions 131, the light emitted from the micro LED unit 121 can be reflected by the reflective portion 131 surrounding the upper side of the micro LED unit 121 and then outputted via the through hole. Therefore, the arrangement of the reflective portions 131 can improve the light-emitting efficiency, and at the same time prevent the problem of light crosstalk between the sub-pixels (the micro LED units 121). The closer the reflective portion 131 is to the light-emitting layer 121b of the adjacent micro LED unit 121, the better the reflection (light blocking) effect. In this embodiment, the distance between the reflective portion 131 and the corresponding ion implantation region I may be greater than 0 and less than or equal to 2 μm. In other words, each reflective portion 131 is disposed adjacent to but not in contact with the corresponding ion implantation region I. In addition, when applied to devices with high brightness and high current density (e.g. AR device), the configuration of the reflective portions 131 can also reduce power consumption and improve the current crowding effect.

In this embodiment, the depth d1 of the groove G of the epitaxial structure layer 12 is less than the shortest distance d2 between the top surface of the corresponding reflective portion 131 and the second surface S122 ($d1<d2$), but this disclosure is not limited thereto. In different embodiments, the depth d1 may be greater than the shortest distance d2. In different embodiments, the depth d1 and the shortest distance d2 are substantially equal. In some embodiments, the depth d1 of the groove G is, for example, 3 μm. In some embodiments, the shortest distance d2 between the top surface of the reflective portion 131 and the second surface S122 is, for example, 9 μm.

The light conversion layer 14 is disposed in a part of the light transmission regions 132, and the light conversion layer 14 is configured to convert the wavelengths of lights emitted from the corresponding micro LED units 121. In this embodiment, the light conversion layer 14 includes a plurality of separated light conversion portions 141a and 141b, which are located in the corresponding light transmission regions 131, respectively. Each light conversion portion 141a or 141b corresponds to one of the micro LED unit 121. Specifically, in three sub-pixels of one pixel P, the light transmission regions 131 in two sub-pixels are filled with the materials of light conversion portions 141a and 141b for converting the lights into different wavelengths. Herein, the light conversion layer 14 (the light conversion portion 141a or 141b) includes a light conversion material, such as quantum dots, phosphorescent material or fluorescent material. In this embodiment, the light conversion material includes quantum dots, which can form the light conversion portions 141a and 141b. The quantum dots of different sizes can be excited to produce lights of different colors. For example, the quantum dots of different sizes can be excited by blue light to produce red light and green light. The shape of the light conversion portions 141a and 141b of the present embodiment is, for example, an inverted cone shape, and the cross-sectional shape thereof is, for example, a polygonal shape (e.g., an inverted trapezoid shape), but this disclosure is not limited thereto.

In this embodiment, the micro LED display device 1 further includes a light filter layer 16 disposed at one side of the light conversion layer 14 away from the epitaxial structure layer 12. The light filter layer 16 is also filled into a part of the light transmission regions 132. The light filter layer 16 includes a plurality of light filter portions 161*a* and 161*b*, and the light filter portions 161*a* and 161*b* are disposed corresponding to and overlapped with the light conversion portions 141*a* and 141*b*, respectively (e.g. in one-to-one manner). In practice, after the reflective portions 131 of the metal reflective layer 13 defines the plurality of separated light transmission regions 132, the material of the light conversion portions 141*a* and 141*b* and the material of the light filter portions 161*a* and 161*b* are disposed in the corresponding light transmission regions 131 in order. Accordingly, the light conversion portion 141*a* and the light filter portion 161*a* can be formed corresponding to one of the micro LED units 121 (i.e., the region of one sub-pixel), and the light conversion portion 141*b* and the light filter portion 161*b* can be formed corresponding to another one of the micro LED units 121. In this embodiment, the light filter portions 161*a* and 161*b* may include different light filter materials for different color lights, such as a red light filter material and a green light filter material, respectively. Accordingly, in each of the light conversion regions 132 corresponding to the light conversion portions 141*a* and 141*b* and the light filter portions 161*a* and 161*b*, the light (e.g. blue light) emitted from the corresponding sub-pixel (i.e., the corresponding micro LED unit 121) can be converted by the corresponding light conversion portion (141*a* or 141*b*) to generate the desired color light (e.g., red light or green light), which will pass through the corresponding light filter portion (161*a* or 161*b*) and then being outputted. In other embodiments, for example, if the thickness of the light conversion portions 141*a* and 141*b* is large enough to make the color purity of light reach the requirement, it is possible to remove the light filter layer 16 (the light filter portions 161*a* and 161*b*). In addition, when a thicker light conversion layer 14 (the light conversion portions 141*a* and 141*b*) is used to obtain a higher color purity of light, a thicker conductive portion 131 is also needed. In different embodiments, the micro LED units 121 may be cooperated with other corresponding light conversion portions (and/or light filter portions) so as to generate the light of different color (e.g., yellow light or white light), but this disclosure is not limited thereto. To be noted, the "depth", "thickness", "distance" or "height" mentioned in this disclosure refers to the depth, thickness, distance or height in the direction D perpendicular to the bonding surface S111 or the first surface S121 of the epitaxial structure layer 12, and the "width" mentioned in this disclosure refers to the width in the direction parallel to the bonding surface S111 or the first surface S121 of the epitaxial structure layer 12

The light-shielding structure 15 includes a plurality of light-shielding portions 151, and the light-shielding portions 151 are disposed on the reflective portions 131. Each of the light-shielding portions 151 is located around the corresponding light transmission region 132, and the light-shielding portions 151 do not cover the light transmission regions 132. In other words, the light-shielding structure 15 does not block the corresponding light transmission region 132 (the light conversion portion 141*a*, 141*b* or the light filter portion 161*a*, 161*b*) in the direction D perpendicular to the first surface S121 of the epitaxial structure layer 12, so that the light can be outputted. The material of the light-shielding structure 15 (including the light-shielding portions 151) can be a conductive or insulation opaque material (e.g., a black material) for shielding or absorbing the light so as to prevent the decrease of display quality caused by the reflection of environmental light (e.g. glare, decrease in contrast, etc.).

As mentioned above, when the micro LED display device 1 is enabled, for example, the first electrode 111 can have a high potential, and the second electrode 112 can have a ground potential or a low potential. The current generated by the potential difference between the first electrode 111 and the second electrode 112 (i.e., the driving voltage) can enable the corresponding micro LED units 121 to emit the corresponding red light, green light and blue light. More specifically, in the micro LED display device 1, the driving element (e.g., an active element such as TFT) of the circuit substrate 11 can control to apply different voltages through the corresponding conductive patterns and/or circuit layers, thereby making the corresponding first electrodes 111 have different high potentials. Accordingly, the micro LED units 121 can emit blue light, and the emitted light can then be converted to the red light and green light by the light conversion portions 141*a*, 141*b* and the light filter portions 161*a*, 161*b*. The spatial distribution of these light beams with different colors and different intensities can form an image that can be seen by viewers, so that the micro LED display device 1 can function as a full-color display device.

Different from the conventional process of manufacturing the micro LED units by etching, this embodiment implants ions on the first surface S121 facing the circuit substrate 11 to form a plurality of separated ion implantation regions I, thereby defining a plurality of micro LED units 121. Accordingly, this embodiment can prevent the damage of the surface of micro light-emitting component, thereby remaining the light-emitting efficiency. In addition, the micro LED display device 1 of this embodiment further includes a metal reflective layer 13 for assisting the current transmission of each micro LED unit 121 and increasing the conductivity of common electrode to enhance the light-emitting efficiency of micro LED units 121. Moreover, (the reflective portion 131 of) the metal reflective layer 13 has a reflection or light concentrating function, which can avoid the light crosstalk problem between sub-pixels (micro LED units 121).

FIGS. 2A to 2F are schematic diagrams showing micro LED display devices according to different embodiments of this disclosure.

Figure 2A:
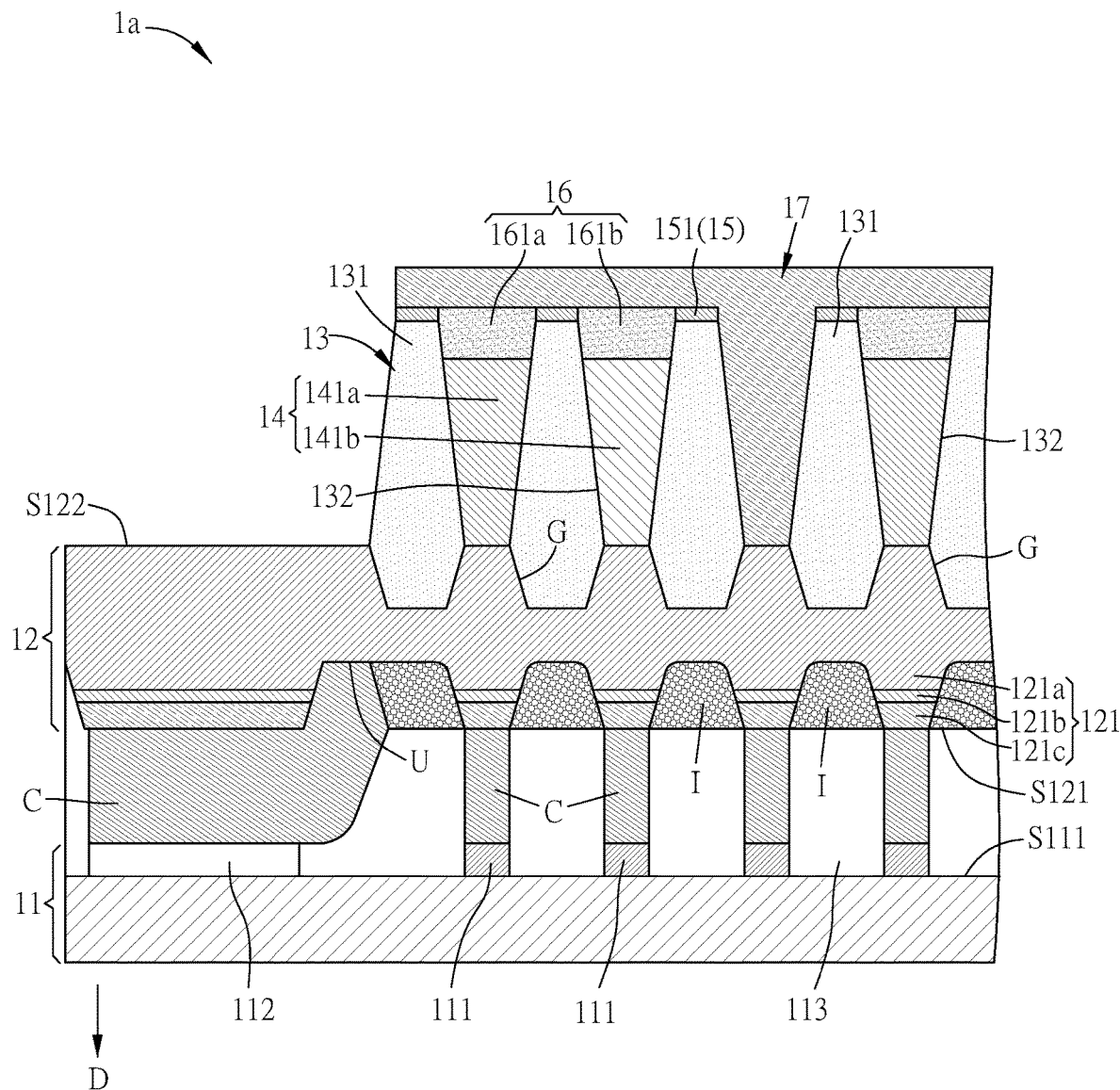
FIGS. 2A to 2F are schematic diagrams showing micro LED display devices according to different embodiments of this disclosure.

As shown in FIG. 2A, the component configurations and connections of the micro LED display device 1*a* of this embodiment are most the same as those of the micro LED display device 1 of the previous embodiment. Unlike the previous embodiment, the micro LED display device 1*a* of this embodiment further includes a light transmission layer 17, which is disposed at one side of the light conversion layer 14 away from the epitaxial structure layer 12. In this embodiment, the light transmission layer 17 covers parts of the light-shielding structure 15 (the light-shielding portion 151) and the light filter layer 16 (the light filter portions 161*a* and 161*b*), and a part of the material of the light transmission layer 17 fills into the light transmission regions 132, which are not configured with the light conversion layer 14 (and the light filter layer 16). The light transmission layer 17 can be a light transmission film, and the material thereof may include, for example, acrylic (e.g. PMMA with a density of 1.18 g/cm$^3$), epoxy (with a density of 1.1~1.4 g/cm$^3$), or polyurethane (PU), but this disclosure is not limited thereto. For example, the material of the light transmission layer 17 may include inorganic materials, such as silicon oxide (SiO$_x$), titanium dioxide (TiO$_2$), aluminum oxide (Al$_2$O$_3$), silicon nitride (SiN$_x$), or the like. In addition, the thickness of the light transmission layer 17 can be less than or equal to 20 µm, and preferably less than 0.5 µm (e.g., 0.15 µm). If the light transmission layer 17 has a thinner thickness, the light transmission layer 17 covers the side walls of the light transmission regions 132, which are not configured with the light conversion structure 14 and the light filter layer 16. In other words, the light transmission layer 17 forms a non-planar surface, which is based on the geometry of the covered layers, instead of forming a planar surface in a whole. In some embodiments, the light transmission layer 17 can be, for example but not limited to, an anti-reflection film, an anti-glare film, an anti-finger printing film, a waterproof and antifouling film, or an anti-scratch film, or a combination thereof, and this disclosure is not limited. The light transmission layer 17 of this embodiment can be applied to any of other embodiments of this disclosure.

Figure 2B:
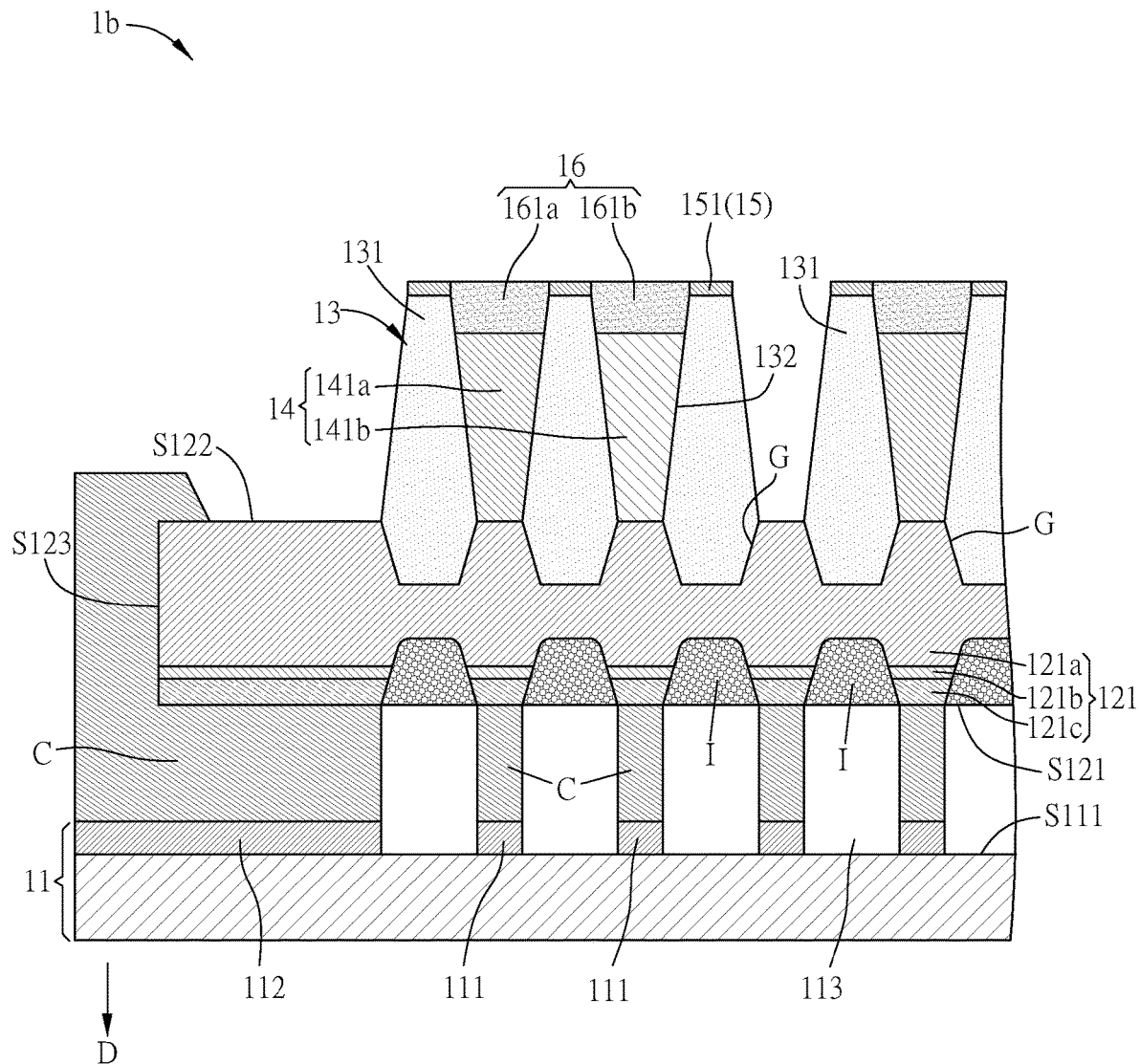

As shown in FIG. 2B, the component configurations and connections of the micro LED display device 1b of this embodiment are most the same as those of the micro LED display device of the previous embodiment. Unlike the previous embodiment, in the micro LED display device 1b of this embodiment, the epitaxial structure layer 12 further includes an outside surface S123, the outside surface S123 connects the first surface S121 and the second surface S122, and the conductive member C extends from the second electrode 112 to the outside surface S123 of the epitaxial structure layer 12. The circuit substrate 11 outputs a common electrode signal to the epitaxial structure layer 12 through the common electrode (the second electrode 112) and the conductive member C connecting to the outside surface S123. The feature of this embodiment that transmits the common electrode signal to the epitaxial structure layer 12 through the conductive member C connecting to the outside surface S123 can be applied to any of other embodiments of this disclosure.

Figure 2C:
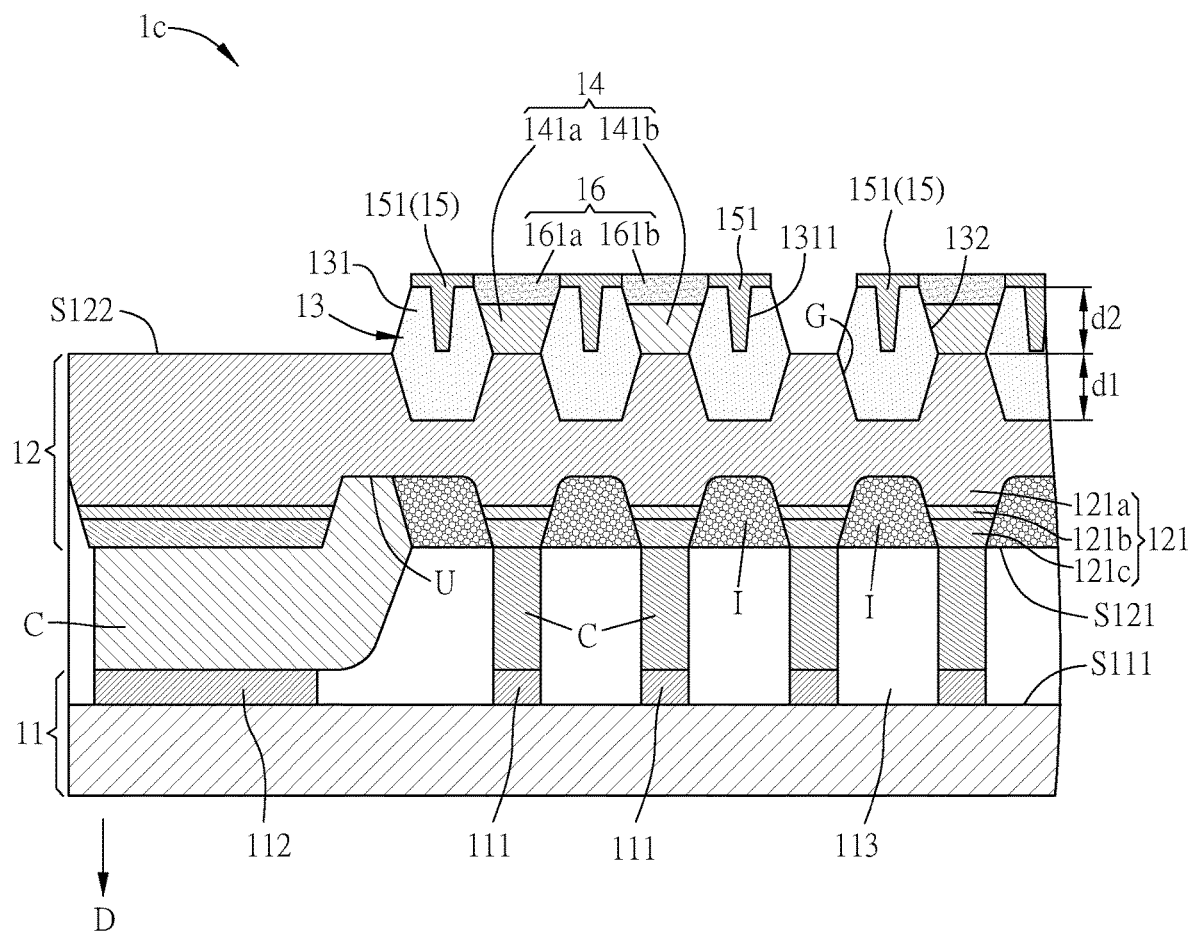

As shown in FIG. 2C, the component configurations and connections of the micro LED display device 1c of this embodiment are most the same as those of the micro LED display device of the previous embodiment. Unlike the previous embodiment, in the micro LED display device 1c of this embodiment, the vertical distance d2 between the top surface of each reflective portion 131 and the second surface S122 is almost the same as the depth d1 of the groove G (d1≈d2, e.g. about 3 µm). Moreover, one side (top surface) of each reflective portion 131 away from the epitaxial structure layer 12 is configured with a concave portion 1311, and the material of each light-shielding portion 151 is filled into the corresponding concave portion 1311.

Figure 2D:
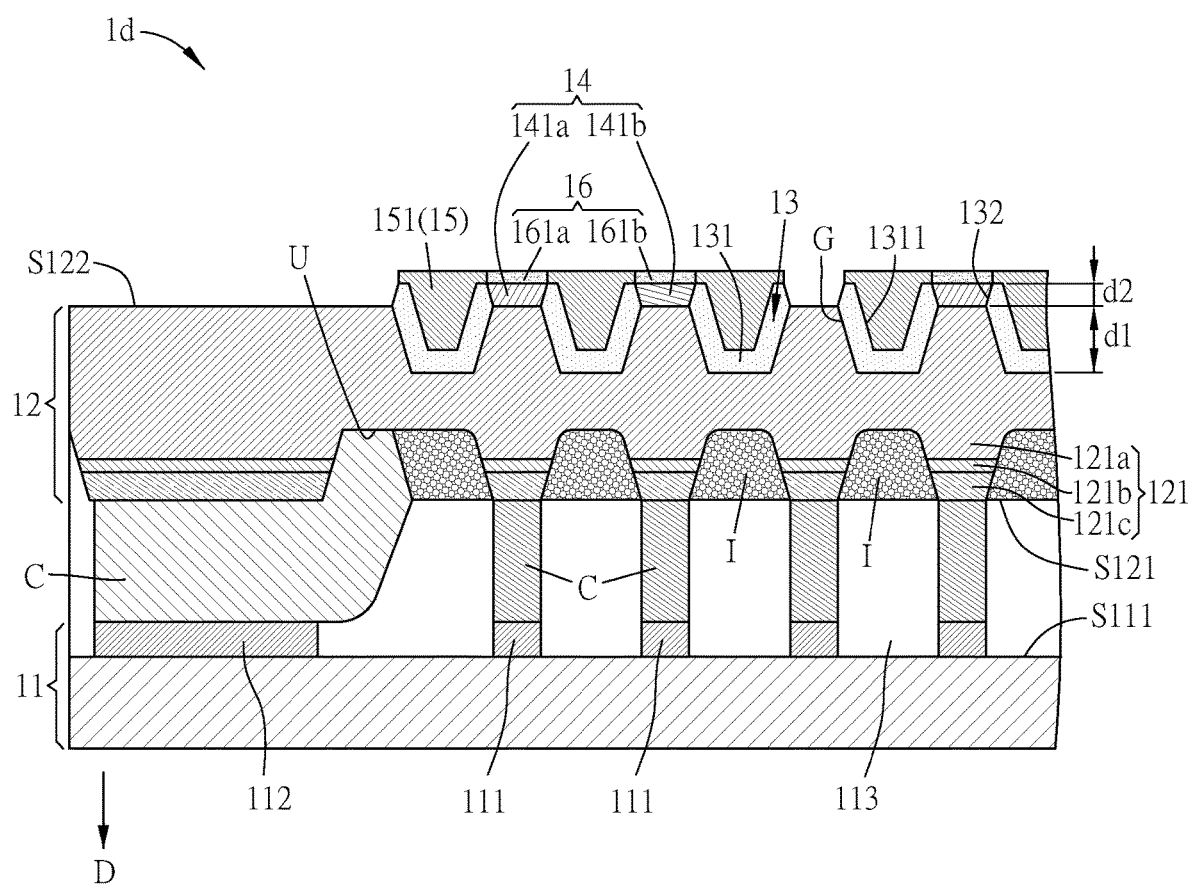

As shown in FIG. 2D, the component configurations and connections of the micro LED display device 1d of this embodiment are most the same as those of the micro LED display device of the previous embodiment. Unlike the previous embodiment, in the micro LED display device 1d of this embodiment, the depth d1 of the groove G is greater than the distance d2 between the top surface of the corresponding reflective portion 131 and the second surface S122 (d1>d2)

Figure 2E:
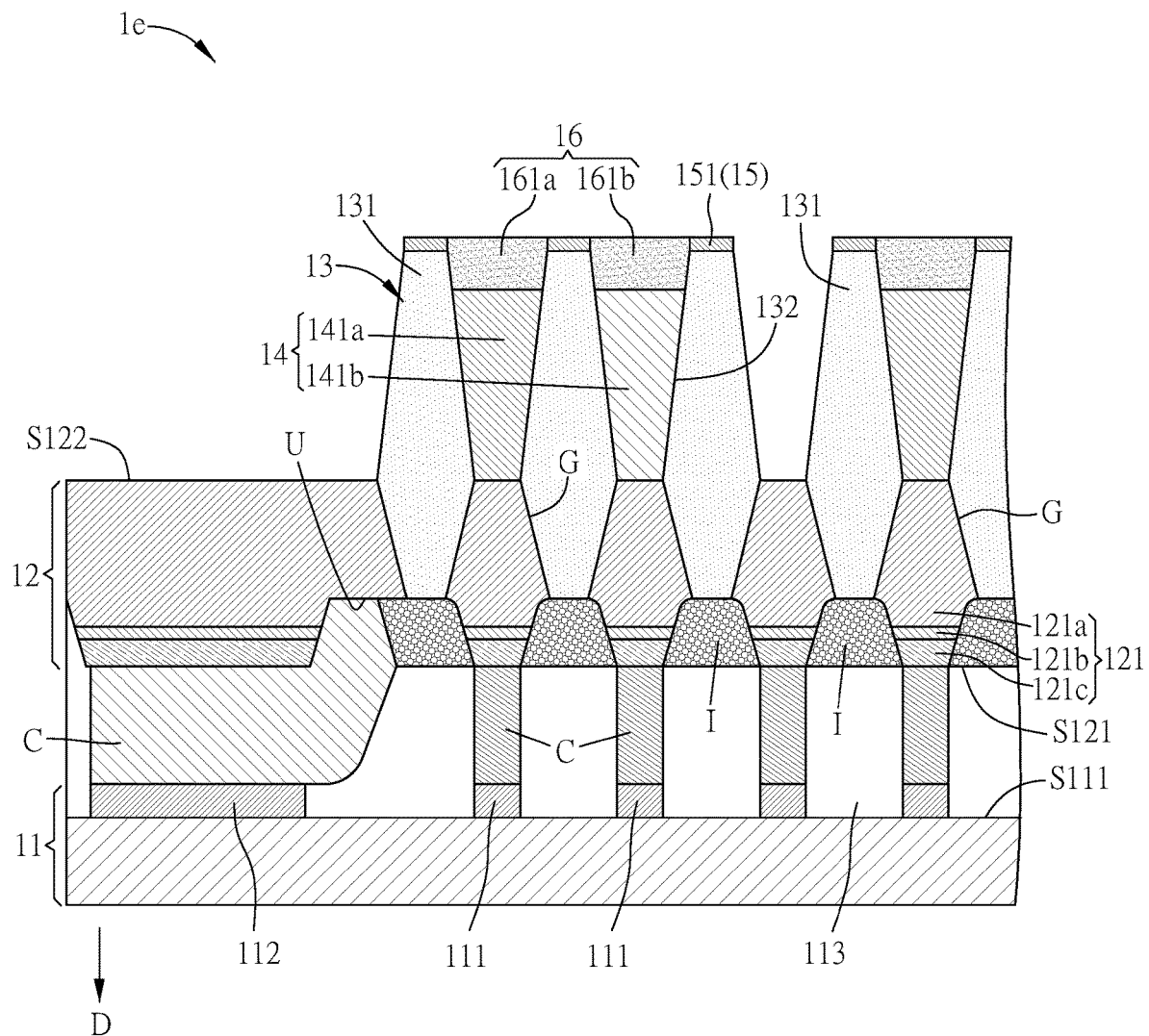

As shown in FIG. 2E, the component configurations and connections of the micro LED display device 1e of this embodiment are most the same as those of the micro LED display device of the previous embodiment. Unlike the previous embodiment, in the micro LED display device 1e of this embodiment, each reflective portion 131 directly contacts the corresponding ion implantation region I so as to obtain the best reflection (light blocking) effect, thereby further decreasing the problem of light crosstalk and improving the display quality.

Figure 2F:
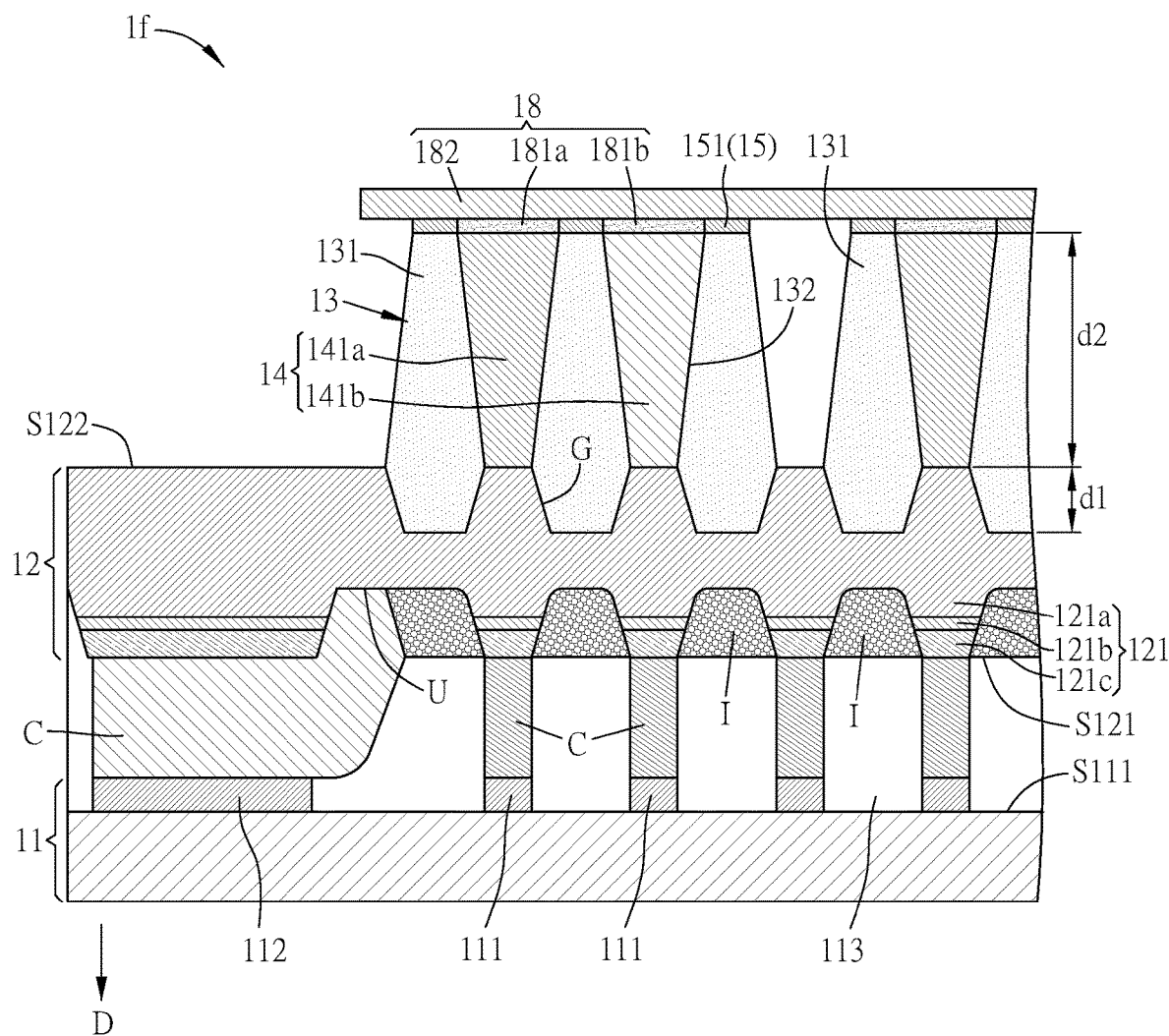

As shown in FIG. 2F, the component configurations and connections of the micro LED display device If of this embodiment are most the same as those of the micro LED display device of the previous embodiment. Unlike the previous embodiment, the micro LED display device If of this embodiment includes a light filter substrate 18, which is disposed at one side of the metal reflective layer 13 away from the epitaxial structure layer 12, instead of the light filter layer 16. In this embodiment, the light filter substrate 18 includes a plurality of light filter portions 181a and 181b, and a substrate 182. The light filter portions 181a and 181b are arranged on a surface of the substrate 182 facing the light conversion layer 14, and the light filter portions 181a and 181b are located corresponding to the light conversion portions 141a and 141b, respectively (in a one-to-one manner). In this embodiment, the light filter portions 181a and 181b may also include different light filter materials for different color lights, such as a red light filter material and a green light filter material, respectively. Accordingly, in each of the light conversion regions 132 corresponding to the light conversion portions 141a and 141b and the light filter portions 181a and 181b, the light (e.g. blue light) emitted from the corresponding sub-pixel (i.e., the corresponding micro LED unit 121) can be converted by the corresponding light conversion portion (141a or 141b) to generate the desired color light (e.g., red light or green light), which will pass through the corresponding light filter portion (181a or 181b) and then being outputted. The light filter substrate 18 of this embodiment can be applied to any of other embodiments of this disclosure.

In summary, without utilizing the conventional etching process in the manufacturing of micro LED units, this disclosure implants ions on the first surface of the epitaxial structure layer facing the circuit substrate to form a plurality of separated ion implantation regions, thereby defining a plurality of micro LED units. Accordingly, this disclosure can prevent the damage of the sidewall of micro light-emitting component, thereby remaining the light-emitting efficiency. In addition, this disclosure further provides a metal reflective layer for increasing the conductivity of common electrode to enhance the light-emitting efficiency of micro LED display device. Moreover, the metal reflective layer has a reflection or light concentrating function, which can avoid the light crosstalk problem between sub-pixels and thus match the demand for high-resolution display.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A micro LED display device, comprising:
a circuit substrate comprising a display area and a non-display area adjacent to the display area;
an epitaxial structure layer disposed on the circuit substrate and comprising a first surface facing the circuit substrate, a second surface away from the circuit substrate, and a plurality of ion implantation regions near the circuit substrate, wherein the ion implantation regions define a plurality of micro LED units spaced apart from each other, the micro LED units are electrically connected to the circuit substrate and are individually controlled to emit light, the first surface is a planar surface within the display area, the second surface has a plurality of grooves, and each of the grooves corresponds to one of the ion implantation regions; and a metal reflective layer comprising a plurality of reflective portions, wherein the reflective portions are correspondingly disposed in the grooves and protruded from the second surface of the epitaxial structure layer, the reflective portions define a plurality of light transmission regions spaced apart from each other, and each of the light transmission regions corresponds to one of the micro LED units.

2. The micro LED display device of claim 1, wherein the epitaxial structure layer further comprises a continuous semiconductor layer, and the semiconductor layer is a common layer of the micro LED units.

3. The micro LED display device of claim 1, wherein each of the micro LED units comprises a first type semiconductor layer, a light-emitting layer and a second type semiconductor layer stacked in order, and an implantation depth of the ion implantation region is greater than a maximum vertical distance between the first surface and the light emitting-layer of the micro LED unit adjacent to the ion implantation region.

4. The micro LED display device of claim 1, wherein the ion implantation regions of the epitaxial structure layer do not emit light.

5. The micro LED display device of claim 1, further comprising:

a light conversion layer disposed in a part of the light transmission regions, wherein the light conversion layer is configured to convert a wavelength of a light emitted from the corresponding micro LED unit.

6. The micro LED display device of claim 1, wherein the first surface of the epitaxial structure layer further has a concave portion in the non-display area, and the circuit substrate outputs a common electrode signal to the epitaxial structure layer through a conductive member connecting to the concave portion.

7. The micro LED display device of claim 1, wherein the epitaxial structure layer further comprises an outside surface, and the circuit substrate outputs a common electrode signal to the epitaxial structure layer through a conductive member connecting to the outside surface.

8. The micro LED display device of claim 1, wherein the reflective portion and the corresponding ion implantation region are overlapped in a direction perpendicular to the first surface.

9. The micro LED display device of claim 8, wherein a distance between the reflective portion and the corresponding ion implantation region is greater than 0 and is less than or equal to 2 μm.

10. The micro LED display device of claim 8, wherein the reflective portion directly contacts the corresponding ion implantation region.

11. The micro LED display device of claim 1, wherein each of the reflective portions comprises a first stacked layer located in the corresponding groove, and a second stacked layer protruding from the corresponding groove.

12. The micro LED display device of claim 1, further comprising:

a light-shielding structure comprising a plurality of light-shielding portions arranged on the reflective portions and exposing the light transmission regions.

13. The micro LED display device of claim 12, wherein one side of each of the reflective portions away from the epitaxial structure layer is configured with a concave portion, and a material of each of the light-shielding portions is filled into the corresponding concave portion.

14. The micro LED display device of claim 1, wherein a width of the micro LED unit is 2~5 μm.

15. The micro LED display device of claim 14, wherein a product of a maximum brightness and a resolution of the micro LED display device is greater than $10^8$.

* * * * *